(12) United States Patent
Oikawa et al.

(10) Patent No.: US 11,894,249 B2
(45) Date of Patent: Feb. 6, 2024

(54) CONTROL DEVICE, PROCESSING APPARATUS, AND CONTROL METHOD

(71) Applicant: Tokyo Electron Limited, Tokyo (JP)

(72) Inventors: Masami Oikawa, Iwate (JP); Tsubasa Watanabe, Iwate (JP); Tomoya Hasegawa, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 499 days.

(21) Appl. No.: 17/031,785

(22) Filed: Sep. 24, 2020

(65) Prior Publication Data

US 2021/0104421 A1 Apr. 8, 2021

(30) Foreign Application Priority Data

Oct. 8, 2019 (JP) .................................. 2019-185453

(51) Int. Cl.
*H01L 21/67* (2006.01)
*C23C 16/44* (2006.01)
*H01J 37/32* (2006.01)

(52) U.S. Cl.
CPC .... *H01L 21/67248* (2013.01); *C23C 16/4405* (2013.01); *H01J 37/32522* (2013.01); *H01J 37/32798* (2013.01); *H01J 37/32862* (2013.01); *H01L 21/67253* (2013.01)

(58) Field of Classification Search
CPC ......... C23C 16/04; C23C 16/06; C23C 16/44; C23C 16/56; C23C 16/02; H01L 21/67; H01L 21/00; H01L 25/00; H01L 29/00
See application file for complete search history.

(56) References Cited

U.S. PATENT DOCUMENTS

| 6,375,756 B1* | 4/2002 | Ishibashi ............. C23C 16/4405 134/19 |
| 2011/0190924 A1* | 8/2011 | Yokouchi ................ C23C 16/52 700/121 |
| 2012/0064733 A1* | 3/2012 | Sasajima ........... C23C 16/45527 257/E21.24 |
| 2012/0208300 A1* | 8/2012 | Cheshire ............. H01J 37/3244 257/E21.526 |
| 2015/0011091 A1* | 1/2015 | Takenaga .............. C23C 16/045 700/121 |

FOREIGN PATENT DOCUMENTS

JP 2006-066540 A 3/2006

* cited by examiner

*Primary Examiner* — Kidest Bahta
(74) *Attorney, Agent, or Firm* — Venjuris, P.C.

(57) ABSTRACT

A control device controls an operation of a processing apparatus for performing a processing in a processing container that accommodates a substrate. The control device includes: a temperature acquisition unit configured to acquire a temperature inside the processing container; a storage unit configured to store relationship information indicating a relationship between the temperature inside the processing container and an etching rate, and film thickness information including a cumulative film thickness of a deposited film inside the processing container; a rate calculator configured to calculate an etching rate of the deposited film based on the temperature acquired by the temperature acquisition unit and the relationship information stored in the storage unit; and a time calculator configured to calculate an etching time for removing the deposited film based on the etching rate calculated by the rate calculator and the film thickness information stored in the storage unit.

13 Claims, 3 Drawing Sheets

| POSITION | TEMPERATURE |
|---|---|
| TOP | 30°C |
| C-T | 32°C |
| CTR | 34°C |
| C-B | 32°C |
| BTM | 32°C |

| E/R | 30°C | 32°C | 34°C | 36°C |
|---|---|---|---|---|
| 4000Pa | A1 | B1 | C1 | D1 |
| 5000Pa | A2 | B2 | C2 | D2 |
| 6000Pa | A3 | B3 | C3 | D3 |

CONTROL DEVICE, PROCESSING APPARATUS, AND CONTROL METHOD

CROSS-REFERENCE TO RELATED APPLICATIONS

This application is based on and claims priority from Japanese Patent Application No. 2019-185453 filed on Oct. 8, 2019 with the Japan Patent Office, the disclosure of which is incorporated herein in its entirety by reference.

TECHNICAL FIELD

The present disclosure relates to a control device, a processing apparatus, and a control method.

BACKGROUND

In a processing apparatus used for a semiconductor process, when a film is formed on a substrate, the film is also deposited inside the apparatus. Thus, in the processing apparatus, a cleaning process is performed for removing the film deposited inside the apparatus by supplying a cleaning gas into a processing container heated to a predetermined temperature (see, e.g., Japanese Patent Laid-Open Publication No. 2006-066540). Japanese Patent Laid-Open Publication No. 2006-066540 manages the time for cleaning the processing apparatus by measuring the concentration of a predetermined gas contained in the gas discharged from the processing container, and cleaning the inside of the apparatus until the concentration reaches a predetermined concentration.

SUMMARY

According an aspect of the present disclosure, a control device controls an operation of a processing apparatus for performing a processing in a processing container that accommodates a substrate. The control device includes: a temperature acquisition unit configured to acquire a temperature inside the processing container; a storage unit configured to store relationship information indicating a relationship between the temperature inside the processing container and an etching rate, and film thickness information including a cumulative film thickness of a deposited film inside the processing container; a rate calculator configured to calculate an etching rate of the deposited film based on the temperature acquired by the temperature acquisition unit and the relationship information stored in the storage unit; and a time calculator configured to calculate an etching time for removing the deposited film based on the etching rate calculated by the rate calculator and the film thickness information stored in the storage unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
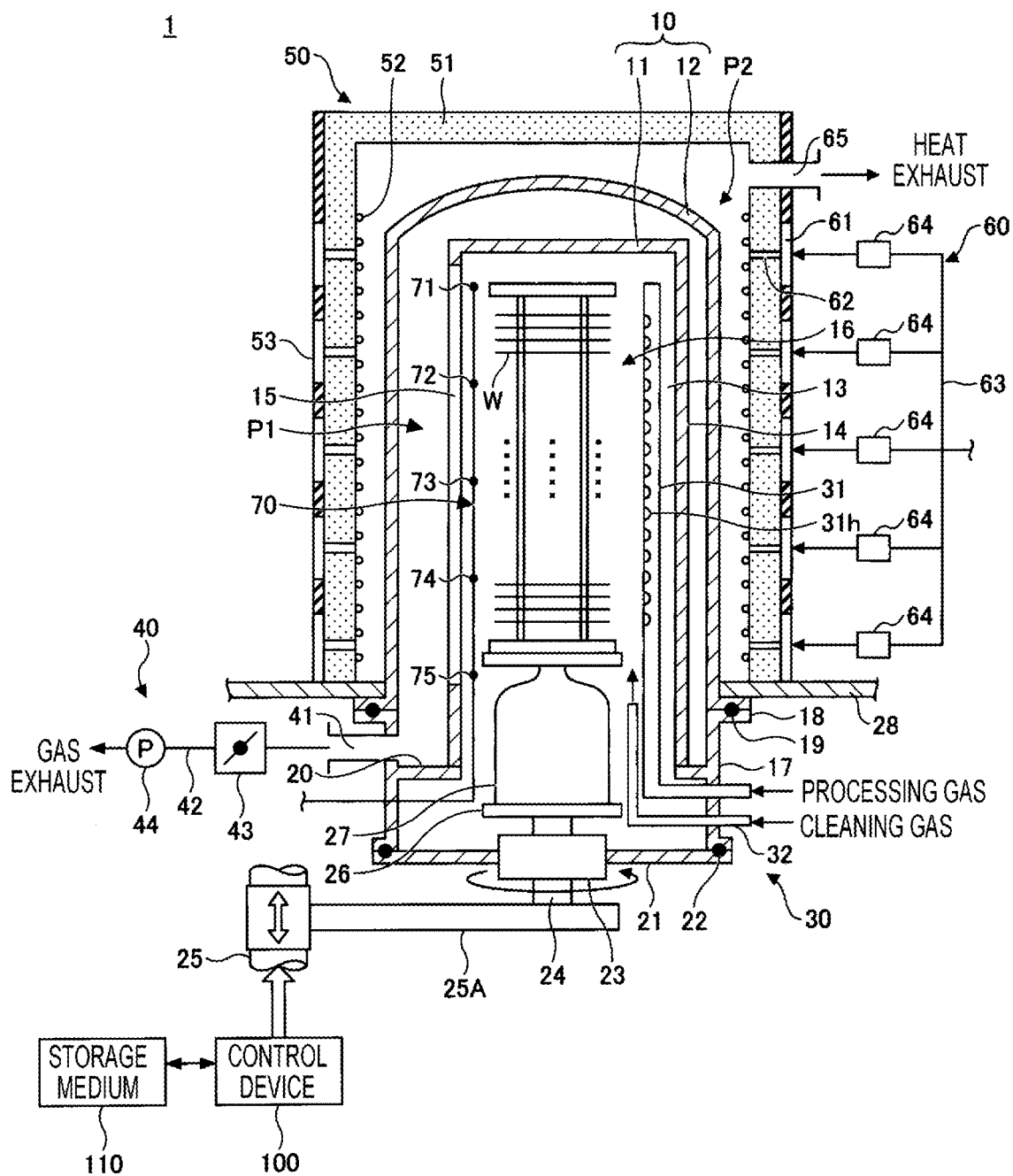
FIG. 1 is a schematic view illustrating an example of a configuration of a processing apparatus according to an embodiment.

In the following detailed description, reference is made to the accompanying drawings which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, a non-limiting embodiment of the present disclosure will be described with reference to the accompanying drawings. In all of the accompanying drawings, similar or corresponding members or components will be denoted by the same reference numerals, and overlapping descriptions thereof will be omitted.

[Etching Reaction]

When a silicon oxide film ($SiO_2$) is etched using hydrogen fluoride (HF) gas at a room temperature, water ($H_2O$) is generated as represented by the following reaction formula (1).

$$SiO_2(s) + 4HF(g) \rightarrow SiF_4 + 2H_2O(l) \tag{1}$$

The generated water reacts with the hydrogen fluoride gas to generate hydrofluoric acid (HF(aq)) as represented by the following reaction formula (2).

$$HF(g) + H_2O(l) \rightarrow HF(aq) \tag{2}$$

The hydrofluoric acid etches the silicon oxide film as represented by the following reaction formula (3).

$$SiO_2(s) + 4HF(aq) \rightarrow SiF_4 + 6H_2O(l) \tag{3}$$

The reaction rate of the reaction formula (1) is very small, as compared with the reaction rates of the reaction formulas (2) and (3). Thus, the etching reaction of the silicon oxide film with the hydrogen fluoride gas at the room temperature becomes the reaction form where the generation of water ($H_2O$) is the key to the etching reaction. That is, from the viewpoint of the vapor pressure, the etching reaction is largely affected by the temperature during the etching.

However, when a cleaning process is performed for removing a film deposited inside a processing container at or near a room temperature, it may be difficult to control the temperatures inside processing containers of all apparatuses to the same temperature, due to differences in apparatuses (e.g., an installation environment and a cooling capacity). As a result, the etching rate changes due to the difference in temperature of the processing container, which may cause an over-etching or a film residue.

Thus, in an embodiment, an etching time is calculated based on an actually measured temperature inside a processing container, relationship information indicating a relationship between a temperature and an etching rate, and a cumulative film thickness of a deposited film, and the cleaning process is performed based on the calculated etching time. As a result, it is possible to suppress the over-etching or film residue caused from the cleaning process performed in a temperature range where a temperature control is difficult (e.g., at or near a room temperature). Detailed descriptions are made herein below.

[Processing Apparatus]

FIG. 1 is a schematic view illustrating an example of a configuration of a processing apparatus according to an embodiment. As illustrated in FIG. 1, a processing apparatus 1 includes, for example, a processing container 10, a gas supply 30, an exhaust unit 40, a heating unit 50, a cooling unit 60, a temperature sensor 70, and a control device 100.

The processing container 10 accommodates a semiconductor wafer (hereinafter, referred to as a "wafer W") which is a substrate. The processing container 10 includes a cylindrical inner tube 11 opened at the lower end thereof and having a ceiling, and a cylindrical outer tube 12 opened at the lower end thereof and having a ceiling that covers the external side of the inner tube 11. The inner tube 11 and the outer tube 12 are formed of a heat resistant material such as quartz, and are coaxially arranged to form a double-tube structure.

The ceiling of the inner tube 11 is, for example, flat. An accommodation portion 13 is formed on one side of the inner tube 11 to accommodate a gas nozzle along the longitudinal (vertical) direction of the inner tube 11. In an embodiment, a portion of the side wall of the inner tube 11 projects outward to form a convex portion 14, and the inside of the convex portion 14 serves as the accommodation portion 13.

A rectangular opening 15 is formed in the opposite side wall of the inner tube 11 along the longitudinal (vertical) direction of the inner tube 11 to face the accommodation portion 13.

The opening 15 is a gas exhaust port formed to exhaust a gas inside the inner tube 11. The opening 15 extends vertically to have the length which is the same as or longer than the length of a wafer boat 16.

The lower end of the processing container 10 is supported by a cylindrical manifold 17 formed of, for example, stainless steel. A flange 18 is formed on the upper end of the manifold 17, and the lower end of the outer tube 12 is supported on the flange 18. A sealing member 19 such as an O-ring is interposed between the flange 18 and the lower end of the outer tube 12 to keep the inside of the outer tube 12 in an airtight state.

An annular support 20 is provided on the inner wall of an upper portion of the manifold 17, and the lower end of the inner tube 11 is supported on the support 20. A lid 21 is airtightly attached to an opening of the lower end of the manifold 17 via a sealing member 22 such as an O-ring, and airtightly seals the opening of the lower end of the processing container 10, that is, the opening of the manifold 17. The lid 21 is formed of, for example, stainless steel.

A rotary shaft 24 is provided to penetrate the center of the lid 21 and configured to rotatably support the wafer boat 16 via a magnetic fluid sealing unit 23. The lower portion of the rotary shaft 24 is rotatably supported by an arm 25A of a lifting mechanism 25 including a boat elevator.

A rotary plate 26 is provided on the upper end of the rotary shaft 24, and the wafer boat 16 that holds wafers W is placed on the rotary plate 26 via a heat reserving base 27 made of quartz. By moving the lifting mechanism 25 up and down, the lid 21 and the wafer boat 16 are moved up and down in an integrated form, such that the wafer boat 16 may be inserted into and separated from the processing container 10. The wafer boat 16 is a substrate holder that may be accommodated in the processing container 10 and holds a plurality of wafers W in a shelf shape at a predetermined interval.

The gas supply 30 is provided in the manifold 17. The gas supply 30 introduces a predetermined gas such as a processing gas, a cleaning gas or a purging gas into the inner tube 11. The gas supply 30 includes gas nozzles 31 and 32.

The gas nozzle 31 is made of, for example, quartz, is provided in the inner tube 11 along the longitudinal direction of the inner tube 11, and is supported such that the base end thereof is bent into an L shape to penetrate the manifold 17. A plurality of gas holes 31h is formed in the gas nozzle 31 at a predetermined interval along the longitudinal direction of the gas nozzle 31, and a gas is discharged in the horizontal direction from the gas holes 31h. For example, the predetermined interval is set to be the same as the interval between the wafers W supported by the wafer boat 16. The position of each gas hole 31h in the height direction is set such that the gas hole 3h is positioned in the middle between the wafers W which are adjacent to each other in the vertical direction, and a gas may be supplied to the space between the wafers W. The gas nozzle 31 supplies, for example, a processing gas or a purging gas, and supplies the processing gas or the purging gas into the processing container 10 as necessary while controlling the flow rate thereof. The processing gas is selected according to a type of a film to be formed. For example, when a silicon oxide film is formed, a silicon-containing gas such as dichlorosilane (DCS) gas and an oxidizing gas such as ozone ($O_3$) gas may be used as the processing gas. The purging gas may be, for example, nitrogen ($N_2$) gas or argon (Ar) gas.

The gas nozzle 32 is made of, for example, quartz, is provided at a lower portion inside the inner tube 11 along the longitudinal direction of the inner tube 11, and is supported such that the base end thereof is bent into an L shape to penetrate the manifold 17. The gas nozzle 32 is opened at the tip thereof, and discharges a gas upward from the opening. The gas nozzle 32 supplies, for example, a cleaning gas or a purging gas, and supplies the cleaning gas or the purging gas into the processing container 10 as necessary while controlling the flow rate thereof. The cleaning gas is selected according to a type of a film to be formed inside the processing container 10. For example, when a film to be formed inside the processing container 10 is a silicon oxide film, for example, fluorine-containing gas such as hydrogen fluoride (HF) gas, fluorine ($F_2$) gas, chlorine trifluoride ($ClF_3$) gas or nitrogen trifluoride ($NF_3$) gas may be used as the processing gas.

The gas supply 30 may be configured to supply the processing gas, the cleaning gas, and the purging gas into the processing container 10 from one gas nozzle, and the number of gas nozzles is not limited to the example of FIG. 1.

The exhaust unit 40 exhausts a gas discharged from the inside of the inner tube 11 through the opening 15 and discharged from a gas outlet 41 through a space P1 between the inner tube 11 and the outer tube 12. The gas outlet 41 is formed in the upper side wall of the manifold 17 above the support 20. An exhaust passage 42 is connected to the gas outlet 41. A pressure regulating valve 43 and a vacuum pump 44 are provided in this order in the exhaust passage 42, such that the inside of the processing container 10 may be exhausted.

The heating unit 50 is provided around the processing container 10. The heating unit 50 is provided, for example, on a base plate 28. The heating unit 50 heats the wafers W inside the processing container 10. The heating unit 50 includes, for example, a cylindrical heat insulator 51. The heat insulator 51 is formed mainly of silica and alumina. While the heating unit 50 is not particularly limited as long as the wafers W inside the processing container 10 may be heated, the heating unit 50 may be, for example, an infrared heater that radiates infrared rays to heat the processing container 10. A linear heat generator 52 is provided on the inner periphery of the heat insulator 51 in a spiral or meandering shape. The heat generator 52 is configured such that the temperature of each of a plurality of zones obtained by dividing the heating unit 50 in the height direction is controllable. Hereinafter, the plurality of zones will be referred to as "TOP," "C-T," "CTR," "C-B," and "BTM" in an order from above. The heat generator 52 is held on the inner wall surface of the heat insulator 51 via a holding member (not illustrated). However, a concave portion may be formed in the inner wall surface of the heat insulator 51, and the heat generator 52 may be accommodated in the concave portion.

In order to maintain the shape of the heat insulator 51 and reinforce the heat insulator 51, the outer periphery of the heat insulator 51 is covered with an outer skin 53 made of a metal such as stainless steel. Further, in order to suppress the influence of heat on the outside of the heating unit 50, the outer periphery of the outer skin 53 is covered with a water cooling jacket (not illustrated).

The cooling unit 60 cools the wafers W inside the processing container 10 by supplying a cooling fluid toward the processing container 10. The cooling fluid may be, for example, air. The cooling unit 60 supplies the cooling fluid toward the processing container 10, for example, when rapidly dropping the temperature of the wafers W after a heat processing. Further, the cooling unit 60 supplies the cooling fluid toward the inside of the processing container 10, for example, during a cleaning process for removing a deposited film inside the processing container 10. The cooling unit 60 includes a fluid flow path 61, a spout hole 62, a distribution flow path 63, a flow rate regulator 64, and a heat exhaust port 65.

A plurality of fluid flow paths 61 is formed in the height direction between the heat insulator 51 and the outer skin 53. For example, each fluid flow path 61 is formed on the external side of the heat insulator 51 along the circumferential direction of the heat insulator 51.

The spout hole 62 is formed to penetrate the heat insulator 51 from each fluid flow path 61, and spouts the cooling fluid into a space P2 between the outer tube 12 and the heat insulator 51.

The distribution flow path 63 is provided outside the outer skin 53, and distributes and supplies the cooling fluid to each fluid flow path 61.

The flow rate regulator 64 is interposed in the distribution flow path 63, and regulates the flow rate of the cooling fluid supplied to the fluid flow path 61.

The heat exhaust port 65 is provided above the plurality of spout holes 62, and discharges the cooling fluid supplied into the space P2 to the outside of the processing apparatus 1. The cooling fluid discharged to the outside of the processing apparatus 1 is cooled by, for example, a heat exchanger, and supplied again to the distribution flow path 63. The cooling fluid discharged to the outside of the processing apparatus 1 may be discharged without being reused.

The temperature sensor 70 detects the temperature inside the processing container 10. The temperature sensor 70 is provided, for example, inside the inner tube 11. The temperature sensor 70 may be provided at any position where the temperature inside the processing container 10 is detectable, and may be provided, for example, in the space P1 between the inner tube 11 and the outer tube 12. The temperature sensor 70 has a plurality of temperature measuring units 71 to 75 provided at different positions in the height direction to correspond to, for example, the plurality of zones. The temperature measuring units 71 to 75 are provided to correspond to the zones "TOP," "C-T," "CTR," "C-B," and "BTM," respectively. The plurality of temperature measuring units 71 to 75 may be, for example, thermocouples or thermometric resistors. The temperature sensor 70 transmits temperatures detected by the plurality of temperature measuring units 71 to 75 to the control device 100.

The control device 100 controls the operation of the processing apparatus 1. The control device 100 may be, for example, a computer. A storage medium 110 stores a computer program for performing the entire operation of the processing apparatus 1. The storage medium 110 may be, for example, a flexible disk, a compact disk, a hard disk, a flash memory or a DVD.

[Control Device]

Figures 2, 3:
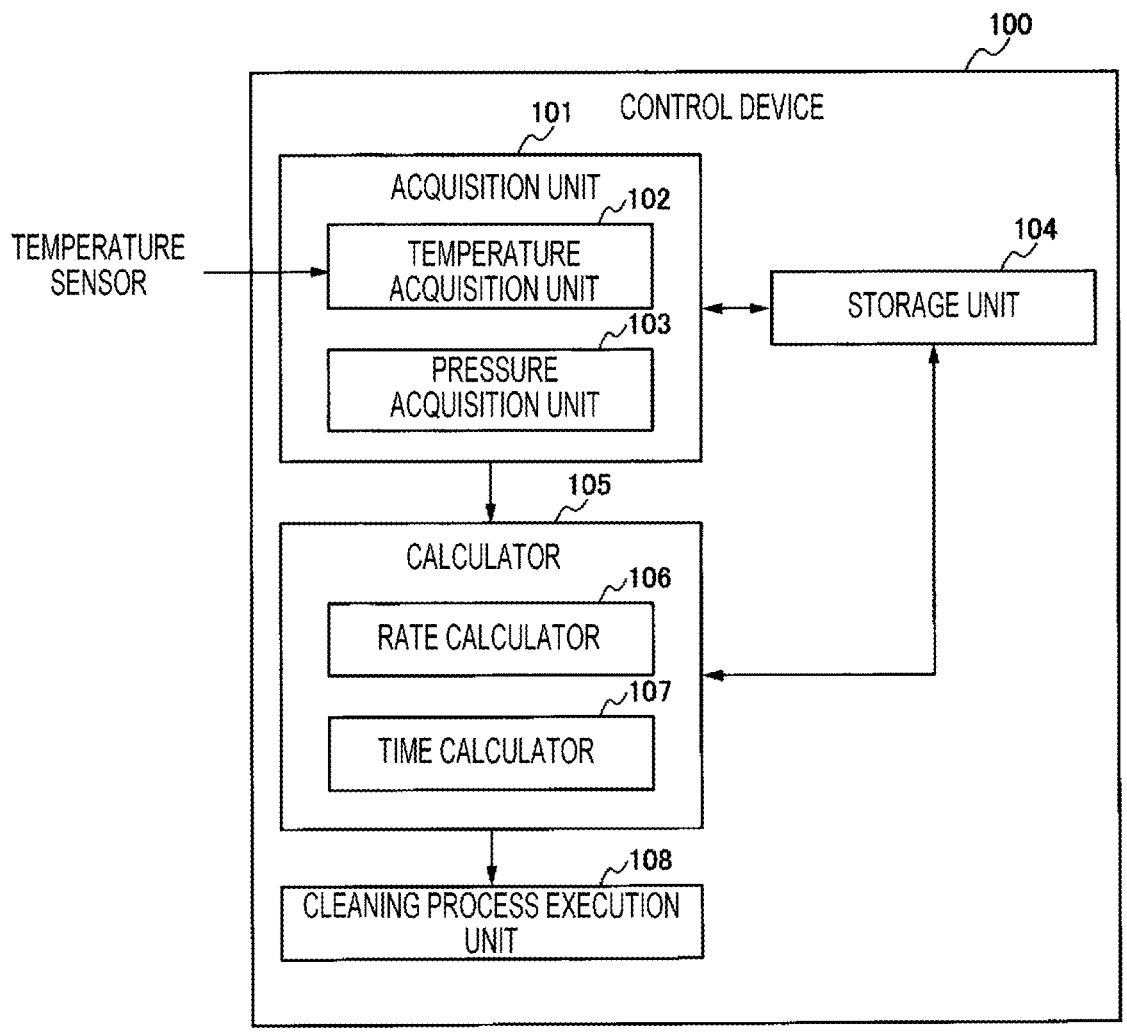
FIG. 2 is a view illustrating an example of a functional configuration of a control device.
FIG. 3 is a view illustrating an example of a temperature detected by a temperature sensor.

FIG. 2 is a view illustrating an example of a functional configuration of the control device 100. As illustrated in FIG. 2, the control device 100 includes an acquisition unit 101, a storage unit 104, a calculator 105, and a cleaning process execution unit 108. The acquisition unit 101, the storage unit 104, the calculator 105, and the cleaning process execution unit 108 are implemented in, for example, a computer.

The acquisition unit 101 acquires information on the processing apparatus 1. The acquisition unit 101 includes a temperature acquisition unit 102 and a pressure acquisition unit 103.

The temperature acquisition unit 102 acquires the temperature inside the processing container 10. The temperature inside the processing container 10 that is acquired by the temperature acquisition unit 102 may be, for example, the temperatures detected by the temperature sensor 70 provided inside the processing container 10. In an embodiment, the temperature acquisition unit 102 acquires the temperatures detected by the plurality of temperature measuring units 71 to 75 provided at different positions in the height direction to correspond to the plurality of zones. FIG. 3 is a view illustrating an example of the temperatures detected by the temperature sensor 70. In the example of FIG. 3, the temperature of the position "TOP" is 30° C., the temperature of the position "C-T" is 32° C., the temperature of the position "CTR" is 34° C., the temperature of the position "C-B" is 32° C., and the temperature of the position "BTM" is 32° C. The temperature acquisition unit 102 stores the acquired temperature inside the processing container 10 in the storage unit 104.

The pressure acquisition unit 103 acquires the pressure inside the processing container 10. The pressure inside the processing container 10 that is acquired by the pressure acquisition unit 103 may be, for example, a set pressure when the cleaning process is executed. The set pressure may be, for example, a pressure determined by a recipe of the cleaning process. The pressure inside the processing container 10 that is acquired by the pressure acquisition unit 103 may be a pressure detected by a pressure sensor (not illustrated) attached to the processing container 10. The pressure acquisition unit 103 stores the acquired pressure inside the processing container 10 in the storage unit 104.

The storage unit 104 stores relationship information indicating a relationship between the temperature inside the processing container 10 and the etching rate E/R (hereinafter, referred to as the "temperature-E/R information") and film thickness information on the cumulative film thickness of a deposited film inside the processing container 10. Further, the storage unit 104 stores information on the processing apparatus 1 that is acquired by the acquisition unit 101 and a calculation result calculated by the calculator 105.

Figures 4, 5:
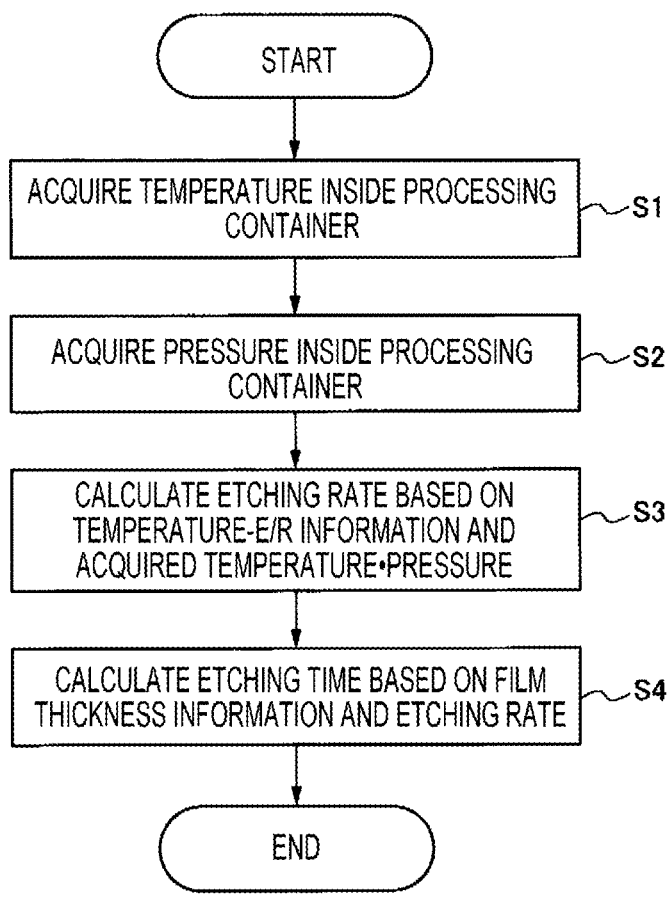
FIG. 4 is a view illustrating an example of relationship information representing a relationship between a temperature inside a processing container and an etching rate.
FIG. 5 is a flowchart illustrating an example of an etching time calculating process.

The temperature-E/R information may be, for example, a table or a mathematical expression. FIG. 4 is a view illustrating an example of the relationship information indicating the relationship between the temperature inside the processing container 10 and the etching rate. As illustrated in FIG. 4, the storage unit 104 stores, for example, the temperature-E/R information for each pressure inside the processing container 10. In the example of FIG. 4, when the pressure inside the processing container 10 is 4,000 Pa, the etching rates E/R are A1, B1, C1, and D1 at temperatures of 30° C., 32° C., 34° C., and 36° C., respectively. When the pressure inside the processing container 10 is 5,000 Pa, the etching rates E/R are A2, B2, C2, and D2 at temperatures of 30° C., 32° C., 34° C., and 36° C., respectively. When the pressure inside the processing container 10 is 6,000 Pa, the etching rates E/R are A3, B3, C3, and D3 at temperatures of 30° C., 32° C., 34° C., and 36° C., respectively. For example, when the silicon oxide film is etched with the HF gas, the lower the temperature inside the processing container 10, the higher the etching rate. That is, the relationships of A1>B1>C1>D1, A2>B2>C2>D2, and A3>B3>C3>D3 are satisfied.

The film thickness information on the cumulative film thickness of the deposited film inside the processing container 10 is obtained by multiplying the film thickness of a deposited film when a heat processing is performed once in the processing container 10 by the number of times of performing the heat processing in the processing container 10.

The calculator 105 executes a calculation based on the information on the processing apparatus 1 that is acquired by the acquisition unit 101 and various types of information stored in the storage unit 104. The calculator 105 includes a rate calculator 106 and a time calculator 107.

The rate calculator 106 calculates the etching rate of the deposited film inside the processing container 10, based on the temperature acquired by the temperature acquisition unit 102 and the temperature-E/R information stored in the storage unit 104. For example, when the temperature acquired by the temperature acquisition unit 102 is 30° C., the pressure acquired by the pressure acquisition unit 103 is 4,000 Pa, and the storage unit 104 stores the temperature-E/R information illustrated in FIG. 4, the rate calculator 106 calculates μl as the etching rate. For example, when the temperature acquired by the temperature acquisition unit 102 includes a plurality of temperatures, the rate calculator 106 calculates the etching rate based on the temperature having the lowest etching rate value among the plurality of temperatures acquired by the temperature acquisition unit 102, and the temperature-E/R information stored in the storage unit 104. Specifically, when the storage unit 104 stores the temperature-E/R information (A1>B1>C1>D1), the rate calculator 106 calculates the etching rate based on the highest temperature among the plurality of temperatures acquired by the temperature acquisition unit 102 and the temperature-E/R information. That is, when the pressure acquired by the pressure acquisition unit 103 is 4,000 Pa, the rate calculator 106 calculates D1 as the etching rate.

The time calculator 107 calculates an etching time for removing the deposited film based on the etching rate calculated by the rate calculator 106 and the film thickness information stored in the storage unit 104. For example, the time calculator 107 calculates the etching time by dividing the cumulative film thickness stored in the storage unit 104 by the etching rate calculated by the rate calculator 106.

The cleaning process execution unit 108 executes the cleaning process by controlling the operation of the processing apparatus 1 to remove the deposited film inside the processing container 10 based on the etching time calculated by the time calculator 107.

[Etching Time Calculating Process]

Descriptions will be made on an example of a process of calculating a time for performing the cleaning process for removing the deposited film that adheres to the inside of the processing container 10 when a thin film is on the wafer W in the processing apparatus 1 (hereinafter, referred to as the "etching time calculating process"). FIG. 5 is a flowchart illustrating an example of the etching time calculating process. The etching time calculating process illustrated in FIG. 5 is executed, for example, after the cleaning process is started, and the temperature inside the processing container 10 is stabilized. The etching time calculating process illustrated in FIG. 5 may be repeatedly executed, for example, each time a predetermined time elapses during the execution of the cleaning process.

In step S1, the temperature acquisition unit 102 acquires the temperature detected by the temperature sensor 70 provided inside the processing container 10.

In step S2, the pressure acquisition unit 103 acquires the set pressure when the cleaning process is executed.

In step S3, the rate calculator 106 calculates the etching rate of the deposited film inside the processing container 10, based on the temperature acquired by the temperature acquisition unit 102 in step S1 and the temperature-E/R information stored in the storage unit 104.

In step S4, the time calculator 107 calculates the etching time for removing the deposited film based on the etching rate calculated by the rate calculator 106 in step S3 and the film thickness information stored in the storage unit 104.

[Operation of Processing Apparatus]

As an example of the operation of the processing apparatus 1, a film forming process for forming a silicon oxide film on the wafer W will be described.

First, the wafer boat 16 that holes a plurality of wafers W is carried into the processing container 10 by the lifting mechanism 25, and the opening of the lower end of the processing container 10 is airtightly closed and sealed by the lid 21.

Then, the exhaust unit 40 exhausts the inside of the processing container 10 such that the pressure in the processing container 10 becomes a predetermined degree of vacuum, the heating unit 50 heats the wafers W in the processing container 10 to a predetermined temperature, and the wafer boat 16 is rotated. Then, the gas supply 30 supplies the silicon-containing gas and the oxidizing gas as the processing gas into the processing container 10. As a result, a silicon oxide film is formed on the wafers W.

Then, the supply of the processing gas from the gas supply 30 is stopped, the heating of the wafers W by the heating unit 50 is stopped, and the rotation of the wafer boat 16 is stopped.

Then, the cooling unit 60 rapidly drops the temperature of the wafers W in the processing container 10. Then, after the temperature of the wafers W in the processing container 10 becomes equal to or lower than a predetermined temperature, the lifting mechanism 25 carries the wafer boat 16 out from the processing container 10, and the film forming process is ended.

As for another example of the operation of the processing apparatus 1, descriptions will be made on a cleaning process for removing a deposited film, including a silicon oxide film, which is deposited inside the processing container 10 when the film forming process is repeatedly performed. The cleaning process is performed once, for example, each time the film forming process is performed a plurality of times. The cleaning process may be performed once, for example, each time the film forming process is performed once.

First, in a state where the wafer boat 16 does not exist inside the processing container 10, the lid 21 airtightly closes and seals the opening of the lower end of the processing container 10.

Then, the exhaust unit 40 exhausts the inside of the processing container 10 such that the pressure in the processing container 10 becomes a predetermined degree of vacuum, and the cooling unit 60 cools the inside of the processing container 10 to a room temperature or a temperature near the room temperature. Then, the gas supply 30 supplies the HF gas as a cleaning gas into the processing container 10, so as to remove the deposited film including the silicon oxide film inside the processing container 10. At this time, the HF gas is supplied for the etching time calculated in the etching time calculating process that is executed prior to the cleaning process as described above. As a result, it is possible to suppress the over-etching or film residue caused from the cleaning process executed at or near a room temperature that falls in the temperature range in which a temperature control is difficult.

Then, the supply of the cleaning gas from the gas supply 30 is stopped, and the cleaning process is ended.

In the example described above, the cleaning process is executed in a state where the wafer boat 16 does not exist inside the processing container 10. However, the present disclosure is not limited thereto. For example, the cleaning process may be executed in a state where the wafer boat 16 holding, for example, dummy wafers exists inside the processing container 10 or the wafer boat 16 exists in an empty state inside the processing container 10.

In the example described above, the HF gas is supplied for the time calculated in the etching time calculating process that is executed prior to the cleaning process. However, the present disclosure is not limited thereto. For example, the etching time calculating process may be executed while the HF gas is supplied during the cleaning process, and the time calculated in the etching time calculating process may be fed back in real time during the time when the HF gas is supplied in the cleaning process. While the temperature inside the processing container 10 may change due to heat generated by the reaction between the silicon oxide film and the HF gas during the supply of the HF gas in the cleaning process, the etching time may be adjusted according to the temperature inside the processing temperature 10 by controlling the etching time in real time. Thus, the over-etching or film residue caused from the cleaning process may be suppressed with a relatively higher accuracy.

As described above, in an embodiment, the control device 100 calculates the etching rate, based on the actually measured temperature inside the processing container 10 and the relationship information indicating the relationship between the temperature and the etching rate. Further, the control device 100 calculates the etching time based on the calculated etching rate and the accumulative film thickness of the deposited film. As a result, the etching time may be adjusted according to the temperature inside the processing container 10 when the cleaning process is executed in the temperature range in which a temperature control is difficult (e.g., at or near a room temperature).

In the embodiment described above, the processing container has the double-tube structure. However, the present disclosure is not limited thereto. For example, the processing container may have a single-tube structure.

In the embodiment described above, the processing apparatus is an apparatus in which a gas is supplied from the gas nozzle disposed along the longitudinal direction of the processing container, and is exhausted from the slit disposed facing the gas nozzle. However, the present disclosure is not limited thereto. For example, the processing apparatus may be an apparatus in which a gas is supplied from a gas nozzle disposed along the longitudinal direction of the wafer boat, and exhausted from an exhaust port disposed above the wafer boat. For example, the processing apparatus may be an apparatus in which the processing gas is supplied from a gas nozzle disposed below the processing container, and exhausted from an exhaust port disposed above the processing container.

In the embodiment described above, the processing apparatus is an apparatus that does not use plasma. However, the present disclosure is not limited thereto. For example, the processing apparatus may be an apparatus that uses plasma, such as a capacitively coupled plasma (CCP) processing apparatus.

In the embodiment described above, the processing apparatus is a batch type apparatus that performs a processing on a plurality of wafers at a time. However, the present disclosure is not limited thereto. For example, the processing apparatus may be a single wafer processing apparatus that processes wafers one by one. For example, the processing apparatus may be a semi-batch type apparatus that processes a plurality of wafers by revolving the wafers placed on a rotary table inside a processing container by the rotary table, and causes the wafers to sequentially pass through a region to which a first gas is supplied and a region to which a second gas is supplied.

In the embodiment described above, the substrate is a semiconductor wafer. However, the present disclosure is not limited thereto. For example, the substrate may be a large-sized substrate for a flat panel display (FPD), a substrate for an organic EL panel or a substrate for a solar cell.

According to the present disclosure, it is possible to suppress an over-etching or film residue caused from a cleaning process.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A control device comprising:
a memory; and
a processor coupled to the memory and configured to:
store, in the memory, relationship information indicating a corresponding relationship between a temperature inside a processing container of a processing apparatus that performs a processing on a substrate accommodated therein and an etching rate of a deposited film inside the processing container, and film thickness information including a cumulative film thickness of the deposited film;
detect, by a temperature sensor, a temperature inside the processing container;

extract an etching rate of the deposited film corresponding to the temperature detected by the temperature sensor from the relationship information stored in the memory;

calculate an etching time for removing the deposited film based on the extracted etching rate of the deposited film and the film thickness information stored in the memory; and execute a cleaning process of the processing apparatus by controlling an operation of the processing apparatus to remove the deposited film inside the processing container based on the etching time.

2. The control device according to claim 1, wherein the temperature sensor is provided inside the processing container.

3. The control device according to claim 1, wherein the temperature sensor detects a plurality of temperatures of different positions in a height direction inside the processing container, and the processor extracts the etching rate of the deposited film corresponding to a highest temperature among the plurality of temperatures detected by the temperature sensor from the relationship information stored in the memory.

4. The control device according to claim 3, wherein the processor is further configured to acquire a pressure inside the processing container,
store the relationship information for each pressure in the memory, and
extract the etching rate of the deposited film corresponding to the temperature and the pressure inside the processing container from the relationship information stored in the memory.

5. The control device according to claim 4, wherein the pressure inside the processing container is a set pressure when a cleaning process is performed to remove the deposited film inside the processing container.

6. The control device according to claim 1, wherein the film thickness information including the cumulative film thickness of the deposited film inside the processing container is obtained by multiplying a film thickness of the deposited film when the processing is performed once in the processing container by a number of times of performing the processing in the processing container.

7. The control device according to claim 1, wherein the processor calculates the etching time by dividing the cumulative film thickness by the etching rate of the deposited film.

8. The control device according to claim 1, wherein the processor calculates the etching time after a cleaning process is started and the temperature inside the processing container is stabilized.

9. The control device according to claim 1, wherein the processor calculates the etching time repeatedly each time a predetermined time elapses during a cleaning process.

10. A processing apparatus comprising:
a processing container configured to accommodate a substrate;
a temperature sensor configured to detect a temperature inside the processing container; and
a control device, wherein the control device is programmed to:
store, in a memory, relationship information indicating a corresponding relationship between a temperature inside the processing container and an etching rate of a deposited film inside the processing container, and film thickness information including a cumulative film thickness of the deposited film, detect a temperature inside the processing container by the temperature sensor, extract an etching rate of the deposited film corresponding to the temperature detected by the temperature sensor from the relationship information stored in the memory, calculate an etching time for removing the deposited film based on the extracted etching rate of the deposited film and the film thickness information stored in the memory, and execute a cleaning process of the processing apparatus by controlling an operation of the processing apparatus to remove the deposited film inside the processing container based on the etching time.

11. The processing apparatus according to claim 10, further comprising: a cooler configured to cool an inside of the processing container, wherein the control device controls the cooler to decrease the temperature inside the processing container to a room temperature or a temperature near the room temperature, and executes the cleaning process.

12. A control method comprising:
storing, in a memory, relationship information indicating a corresponding relationship between a temperature inside a processing container of a processing apparatus that performs a processing on a substrate accommodated therein and an etching rate of a deposited film inside the processing container, and film thickness information including a cumulative film thickness of the deposited film;
detecting, by a temperature sensor, a temperature inside the processing container;
extracting an etching rate of the deposited film corresponding to the temperature detected by the temperature sensor from the relationship information stored in the memory in the storing; and
calculating an etching time for removing the deposited film based on the etching rate of the deposited film extracted in the extracting the etching rate and the film thickness information stored in the memory in the storing.

13. The control method according to claim 12, further comprising:
removing a deposited film inside the processing container based on the etching time calculated in the calculating the etching time, wherein the detecting, the extracting the etching rate, and the calculating the etching time are repeatedly performed during an execution of the removing the deposited film.

* * * * *